United States Patent [19]

Colterjohn, Jr.

[11] Patent Number: 5,602,390

[45] Date of Patent: Feb. 11, 1997

[54] ELECTROSTATIC REPULSION ION MICROSCOPE

[76] Inventor: Walter L. Colterjohn, Jr., 1201 Oak Ridge Cir., Barrington, Ill. 60010

[21] Appl. No.: 626,848

[22] Filed: Apr. 3, 1996

[51] Int. Cl.⁶ .................................................... H01J 49/46
[52] U.S. Cl. ........................................... 250/309; 250/306
[58] Field of Search ................................... 250/309, 306, 250/307, 396 R, 396 ML, 398

[56] References Cited

U.S. PATENT DOCUMENTS

| | | | |
|---|---|---|---|
| 2,548,870 | 4/1951 | Colterjohn, Jr. | 250/309 |
| 4,866,272 | 4/1989 | Aoki | 250/309 |

*Primary Examiner*—Jack I. Berman
*Assistant Examiner*—Kiet T. Nguyen
*Attorney, Agent, or Firm*—Thomas R. Vigil

[57] ABSTRACT

The ion microscope for imaging the surface structure of objects uses an electrostatic lens to direct an incident beam of positive ions generated from ion source toward an electrostatic center of a convex end of an object mounting electrode in a direction which provides for near normal incidence to the surface of the object mounting electrode. The object mounting electrode has an electrical potential relative to that of the ion source sufficient to repel ions upon their close approach to its surface. The electrostatic lens focuses repelled ions upon an ion detector to form an image of the surface of the object mounting electrode and of the objects mounted thereon. A magnetic field is used to separate the ion beams formed by the incident and repelled positive ions to permit location of the detector out of the path of the incident beam obtaining near normal incidence of the illuminating ion beam to the surface of the object mounting electrode.

16 Claims, 5 Drawing Sheets

ELECTROSTATIC REPULSION ION MICROSCOPE

BACKGROUND OF THE INVENTION

1. Field of the Invention

The present invention relates to an ion microscope adapted for imaging the fine structure of complex objects, such as macromolecules and microorganisms. The ion microscope is adapted whereby the surface structure of an object can be observed at high resolution, and whereby internal structure of an object can be observed by combining the controlled removal of surface material with sequential surface imaging.

2. Description of the Related Art

Microscopes which are now available are limited in their ability to image the fine structure of complex objects. In the light microscope, this limit exists at about 200 nm and is imposed mainly by the diffraction of light. In the transmission electron microscope, the diffraction limitation is less severe because of the much shorter wavelength of the electron beam. This permits much higher resolution to be obtained.

A number of other factors are involved in limiting resolution. In the case of the transmission electron microscope, it is difficult to observe structure that is much finer than the thickness of the object. Very thin sections are used and these are supported on very thin films to minimize this limitation. There is also the disruption of fine structure that is caused by electron beam bombardment, and by the processing needed to prepare the object for imaging. When observing thin films of inorganic materials, resolutions at or near atomic structure can be obtained. When observing a small organic object, such as a ribosome having a size of 15 by 10 nm, a resolution of 3 nm is typically the best that can be done. The transmission electron microscope operating under optimum conditions is capable of showing little more than the general shape of such an object. The detailed structure involving hundreds of thousands of atoms cannot be imaged in this way.

The scanning electron microscope provides an image of an object's surface by scanning an electron beam over its surface in a systematic raster pattern while detecting the secondary electrons which are emitted from the object. With organic objects, this emission is from a relatively large region that relates to the penetration and spreading of the scanning beam. The size of this region, in combination with lens aberrations and diffraction effects, limits the fineness of detail which can be observed to less than that of the transmission electron microscope.

The atomic force microscope uses a very sharp electrode tip to scan in a raster pattern over the surface of the object. Forces relating to the structure of the object are sensed and displayed. Resolution capability relate to the fineness of the tip and the way it interacts with the object. At the present time, there are considerable difficulties in imaging the fine structure of organic objects using this microscope.

There are several special purpose microscopes which relate in part to the microscope of the present invention. The first is the point projection field ion microscope described by E. W. Muller, *Zeitschrift Physik*, vol. 131, page 136, in which the well rounded tip of an electrode is imaged at very high resolution by virtue of the linear projection of ions from the tips surface to a fluorescent viewing screen. The ions are produced by a very intense electric field at the tip's surface which causes the disassociation of gas atoms or molecules which condense on the tip's surface. Imaging is limited to materials which can stand the high forces associated with the intense fields needed to produce the ions. The second is the point projection ion microscope described in the Colterjohn Jr., U.S. Pat. No. 2,548,870 in which ions for imaging are generated in an ion source and directed in a parallel beam at the sharply rounded tip end of an electrode, upon which objects to be imaged are mounted. The ions are repelled after coming close enough to the surface to be subject to localized deflection and neutralization. The ions after repulsion are divergent and project an image of the tip's surface upon a fluorescent screen or photographic film. This design has the disadvantage of having a very small field of view because the transverse velocity of the ions at the tip's surface increases quickly as a function of off axis position. This increases the interaction region of an ion with the surface and results in loss of resolution. This design also has the disadvantage of not having a lens aperture. This causes a lack of sensitivity to small deflections produced by object induced field distortions.

The microscope of the present invention is most closely related to the design presented in the Colterjohn patent. It differs from this patent in a number of ways, including provision of mechanisms whereby the severe limitation on the field of view is overcome and imaging sensitivity is improved.

SUMMARY OF THE INVENTION

According to the present invention there is provided, an ion microscope comprising: an ion source for generating a beam of positive ions; an object mounting electrode (OME) having a convex end for receiving an object to be viewed and having an electrical potential relative to said ion source sufficient to repel positive ions; an enclosure having a negative electrical potential relative to the ion source into which the ions are drawn as a beam of positive ions from the ion source toward the OME and generating a beam of repelled positive ions; an ion detector for detecting the spatial relationship of the beam of repelled positive ions and generating an image of object received by the OME; an electrostatic lens, having an entrance pupil, for directing the beam of positive ions toward the electrostatic center of the convex end of the OME, so as to have a near normal incidence to the surface of the convex end of the OME, such that when the beam of positive ions is repelled, the repelled beam of positive ions return back through the electrostatic lens toward the ion detector, with the electrostatic lens causing the repelled ion beam to be focused upon the detector and to project an image of the object upon it; and a magnetic source for producing a magnetic field for deflecting the beam of positive ions and the beam of repelled positive ions sufficient to enable the ion detector to be located outside of the path of the beam of positive ions prior to being repelled.

It is an object of this invention to provide structure to image at high resolution the surface structure and electrical characteristics of objects of interest.

It is an object of this invention to provide structure whereby the subsurface structure and electrical characteristics of objects of interest can be imaged at high resolution.

It is an object of this invention to provide structure for the mounting of objects to facilitate their study.

It is an object of this invention to provide structure for reducing illumination beam current to the object so as to facilitate the observation of electrically insulating objects.

It is an object of this invention to provide structure whereby a relatively large field of view may be imaged at high resolution.

Other objects and advantages of the present application will be apparent from the detailed description and drawings which follow.

DESCRIPTION OF THE PREFERRED EMBODIMENT(S)

Figure 1:
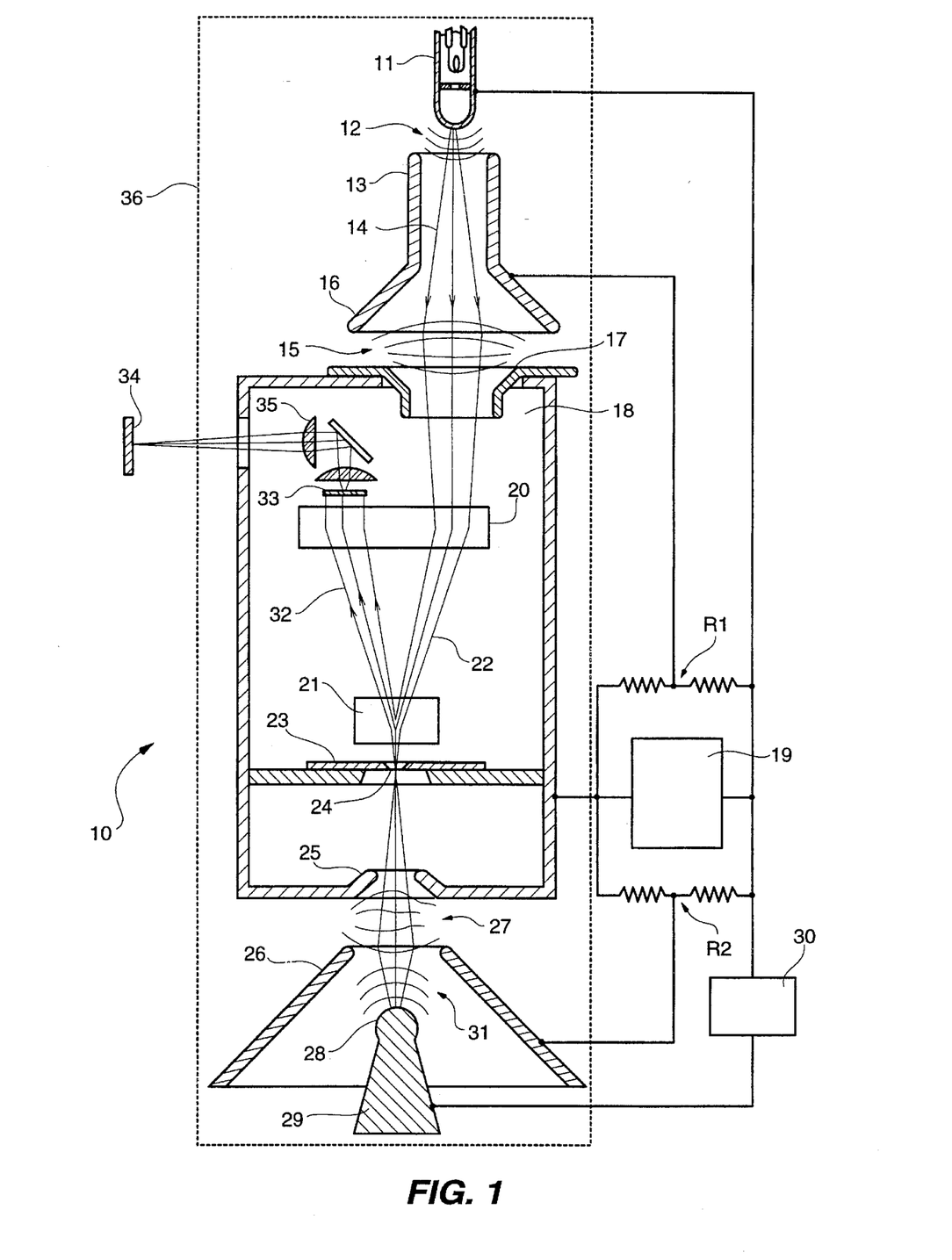
FIG. 1 is a vertical sectional view, partially schematic, of the basic arrangement of the ion microscope constructed according to the teachings of the present invention.

Referring to FIG. 1, an ion microscope 10 is shown to utilize a source of positive ions 11, from which ions are drawn by an electrostatic field 12 between it and an electrode 13, and caused to form a divergent ion beam 14. This beam spreads in diameter, and is caused to converge by the lens action of the electrostatic field 15 between electrodes 16 and 17. The ion beam enters into the chamber 18, which is held at high negative potential relative to the ion source by power supply 19. The beam is subjected to transverse displacement by being deflected by magnetic fields in regions 20 and 21. The convergent beam 22 comes to a focus at the aperture plate 23 which has an aperture 24. The portion of the ion beam which passes through this aperture, diverges and enters into the electrostatic field produced between electrodes 25 and 26, which form the lens 27. It is made convergent by this field, and is directed by it toward the center of the convex rounded tip 28 of the object mounting electrode 29. Electrical potentials for the electrodes 13 and 26 is obtained from two voltage dividers R1 and R2 shown in FIG. 1.

The electrode 29 is held at a potential close to that of the ion source by the power supply 30. An electrostatic field 31, having equipotential surfaces essentially concentric with the electrode tip 28, exists by virtue of the potential between electrode 26 and electrode 29. This field applies a force to the ion beam which decelerates it and causes it, after close approach to the surface of the electrode tip 28, to be accelerated back toward the lens 27. The beam passes through this lens and back through the aperture.

The aperture is positioned at that location where the ion beam from different parts of the field of view crossover. This is the pupil of the lens 27 for those ions having normal incidence upon, and reflection from, the surface of the object mount electrode (OME) 29. The returned ion beam is then caused to be displaced transversely by the magnetic fields 21 and 20, whereby the return beam at 32 is displaced from the incident beam 22. The return beam, after passing through the aperture 24, is then incident upon a detection device, which provides for the sensing of the transverse distribution of the ion beam intensity.

In the arrangement shown in FIG. 1, the detection device comprises a fluorescent screen 33, which emits light upon ion impact, a light sensitive detector 34, and light optics 35 which project an image of the fluorescent screen upon the detector 34. The light detector can be photographic film or an electron-optic detector, such as a CCD array. Direct visual observation of the fluorescent screen is also possible.

The lens 27 provides for the imaging of the surface of the electrode tip, and objects mounted thereon, by focusing the ion beam onto the surface of the detector screen 33. The line 36 is intended to represent the presence of a high vacuum enclosure, which of course is required for the operation of an ion microscope.

Figure 2:
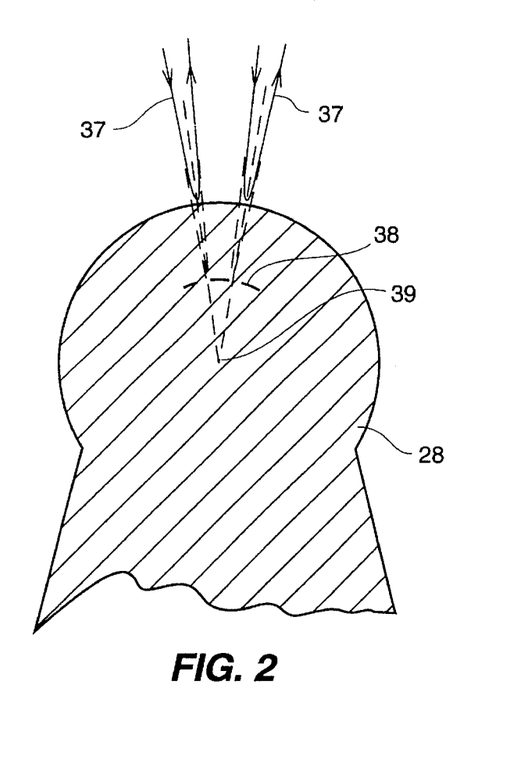
FIG. 2 is an enlarged sectional view of the tip of an object mounting electrode and illustrates ion trajectories and the image plane at the object mounting electrode.

FIG. 2 shows the object mounting tip 28 in greater detail, as well as the ion trajectories 37 and the apparent object focal plane 38. The electrostatic center 39 of the electrode tip is at the projection of the ions having normal incidence to the surface.

Figure 3:
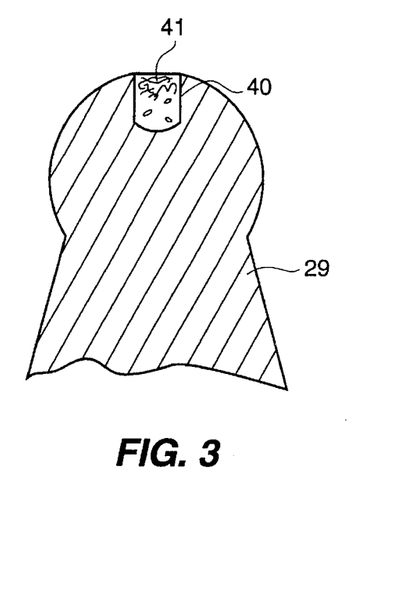
FIG. 3 and FIG. 4 are views similar to the view shown in FIG. 2 and show object mounting arrangements that use a cavity in the object mounting electrode

An arrangement for object mounting is shown in FIG. 3. In this arrangement, a cavity 40 is provided in the end of the electrode 29 into which material for observation 41 can be introduced. The use of a cavity is advantageous because material can be retained with greater ease, and the establishment of a smooth surface is facilitated. The object to be imaged can be dispersed in a liquid matrix material, which can be introduced into the cavity and then hardened.

Surface material can be removed by ion bombardment using the ion beam normally used for imaging. The surface of the object can be bombarded by ions having a controlled velocity by adjusting the bias of the object mount relative to the source. This, combined with the force exerted by the electric field at the surface, can cause a controlled removal of material, and provide for exposing the object and its internal structure. In this cavity mounting arrangement only a limited amount of material can be removed without causing serious disruption of the shape of the electric field at the objects surface. When provision is made for object advancement, however, a considerable depth can be studied.

Figures 4, 6:
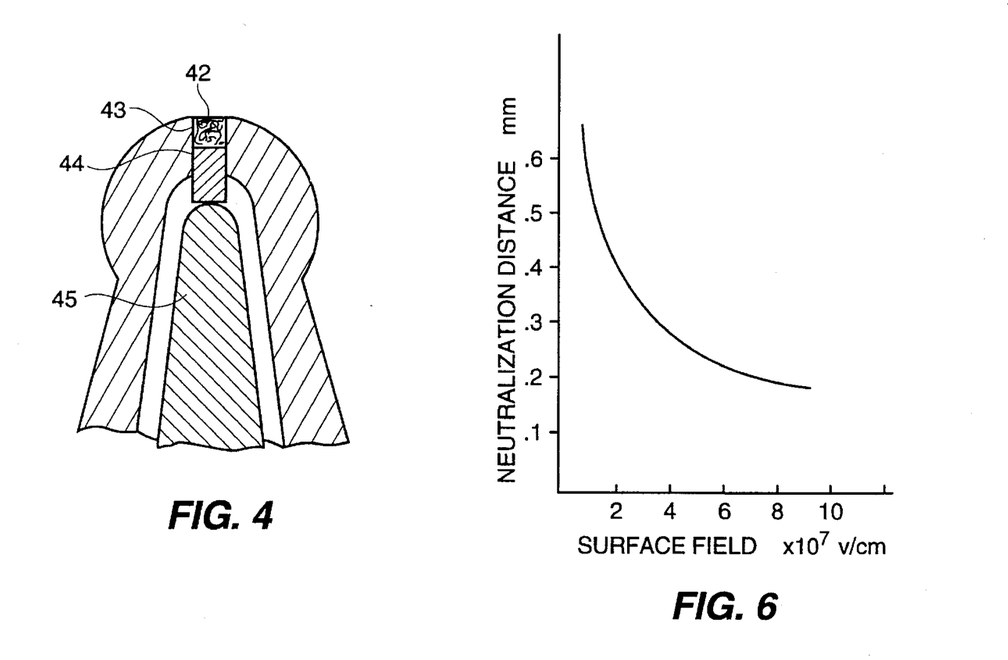
FIG. 6 is a graph of ion capture distance as a function of surface field strength.

The object mounting arrangement shown in FIG. 4 includes structure for advancing the object 42 mounted in a cavity 43. A plug 44 is used with a rod 45. The rod can be actuated by some suitable drive device (not shown), such as a piezoelectric or thermal expansion element, and thereby caused to push against the plug and advance its position and the position of the object.

As surface material is removed by ion bombardment or other methods, the object can be advanced to maintain its surface near that of the tip. The use of a plug is helpful because it isolates the object from the drive rod. The drive rod can be retracted from the plug during observation so as to avoid inadvertent motion due to its expansion or to instability in its drive device.

Figure 5:
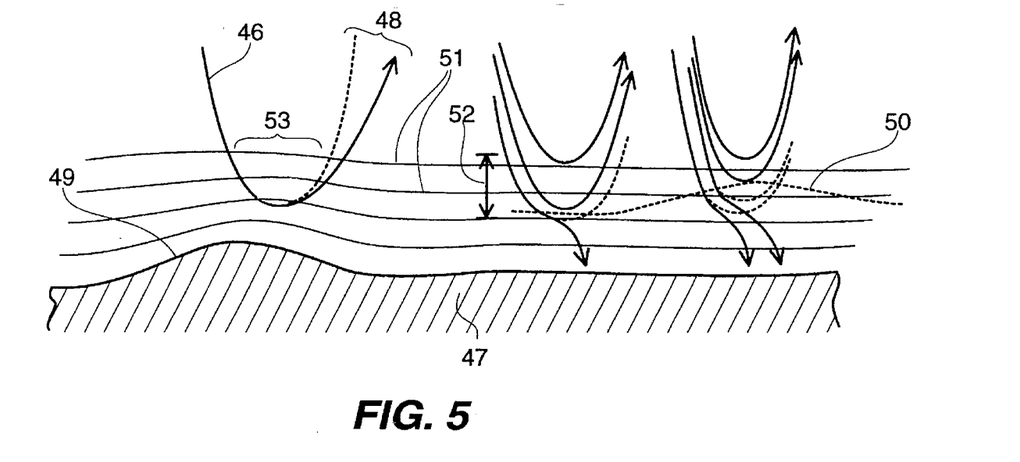
FIG. 5 is an enlarged sectional view of an object and illustrates localized interaction of the ion beam with the surface of the object.

In FIG. 5 the ion beam interaction with the objects surface is illustrated. The ions in the ion beam 46, upon close approach to the object surface 47, are subject to localized transverse deflections 48. These are due to distortions of the applied electrostatic field caused by topographic variations 49 in the objects surface, or caused by electric potential differences in the object. These transverse deflections cause the return beam to have related intensity variations due to the fact that the number of ions that will pass through the aperture 24 will be reduced by these deflections.

The beam is also subject to localized intensity variations caused by variation in the extent to which neutralization of ions in the beam takes place in different regions of the surface. An ion will be drawn into the surface when it approaches too close to the surface. This is due to the electric charge which is induced in the object by the presence of the ion. At some distance, the attractive field produced by the induced charge is equal to the repulsive field created by the applied voltage. This distance can be referred to as the neutralization distance. Its value for a surface of good conductivity is shown in FIG. 6 as a function of the applied field strength. If the surface does not have good conductivity, there will be a lag in the establishment of the induced charge, and the neutralization distance may be substantially smaller.

FIG. 5 illustrates how a variation between the distance at which the capture of ions is likely to take place, represented by line 50, and the distances of the near surface equipotential surfaces, represented by lines 51, results in a variation in the number of ions captured. The axial spread in the repulsion distances 52 of the ions is due to the spread in the axial potential energies of the ions. The smaller this spread, the higher the sensitivity to neutralization variations. Limiting this spread also helps in limiting current to the object at a given level of sensitivity, and thereby helps in avoiding charge buildup on the surface of insulating objects.

To obtain high resolution it is desirable to minimize the transverse turnaround distance 53. This distance tends to establish the size of the region of interaction of an ion with the surface and contributes to the fineness of detail which can be observed. To minimize this distance it is desirable to have a high electric field strength at the surface and a low value of transverse ion velocity at the surface. The minimum value of the transverse velocity is established by loss of resolution relating to diffraction effects, which increase as this velocity decreases. The maximum field strength which can be used depends mainly on the strength of the objects being studied and their adhesion to the object mounting electrode.

The use of high voltage is important in this microscope because of the need to obtain a high field at the object's surface, the need to have an object mount of reasonable size, and the need to minimize the objective lens' aberrations.

Figure 7:
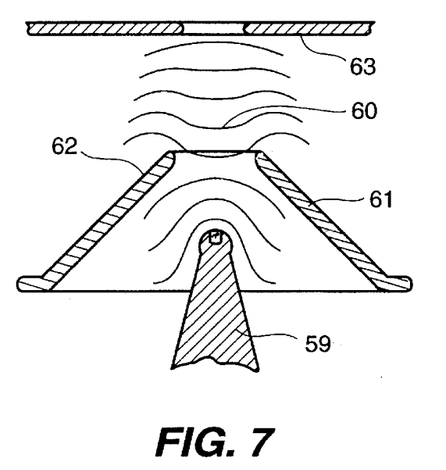
FIG. 7 and FIG. 8 are enlarged sectional views of preferred electrostatic objective lens arrangements.

The lens illustrated in FIG. 7 is designed for short focal length operation at high voltage in the microscope of this invention. It provides a strong lensing action at the opening 60 in the cone electrode 61. It is possible to establish a high field strength there because the electrode surface 62 at high field strength is positive relative to the electrode 63. The field at electrode 63 is reduced because of the conical shape of 61 and its spacing from electrode 63. The electrical breakdown is mainly a function of the field strength at the negative electrode while the focusing capability relates mainly to the field at the positive electrode.

Figure 8:
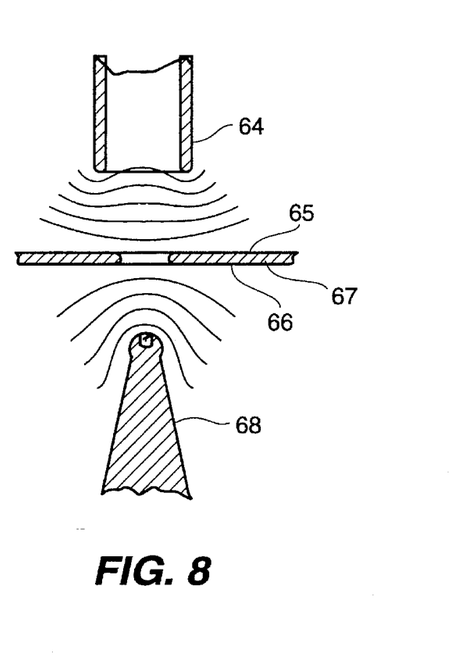

The lens illustrated in FIG. 8 can also be used to advantage in the microscope because of the ability to establish a strong lensing action at the positive electrode 64 while maintaining a lower field at the surfaces 65 and 66 of negative electrode 67. In this lens, however, one must operate with a focal length which is longer than that of the cone lens shown in FIG. 7, and the distance between the electrode 68 and the positive electrode 64, which establishes the minimum focal length, must increase at a near linear rate with voltage. In the lens shown in FIG. 7, there is only a slow increase in the required separation between the object mount 59 and the objective lens element 61 with increased voltage.

Figure 9:
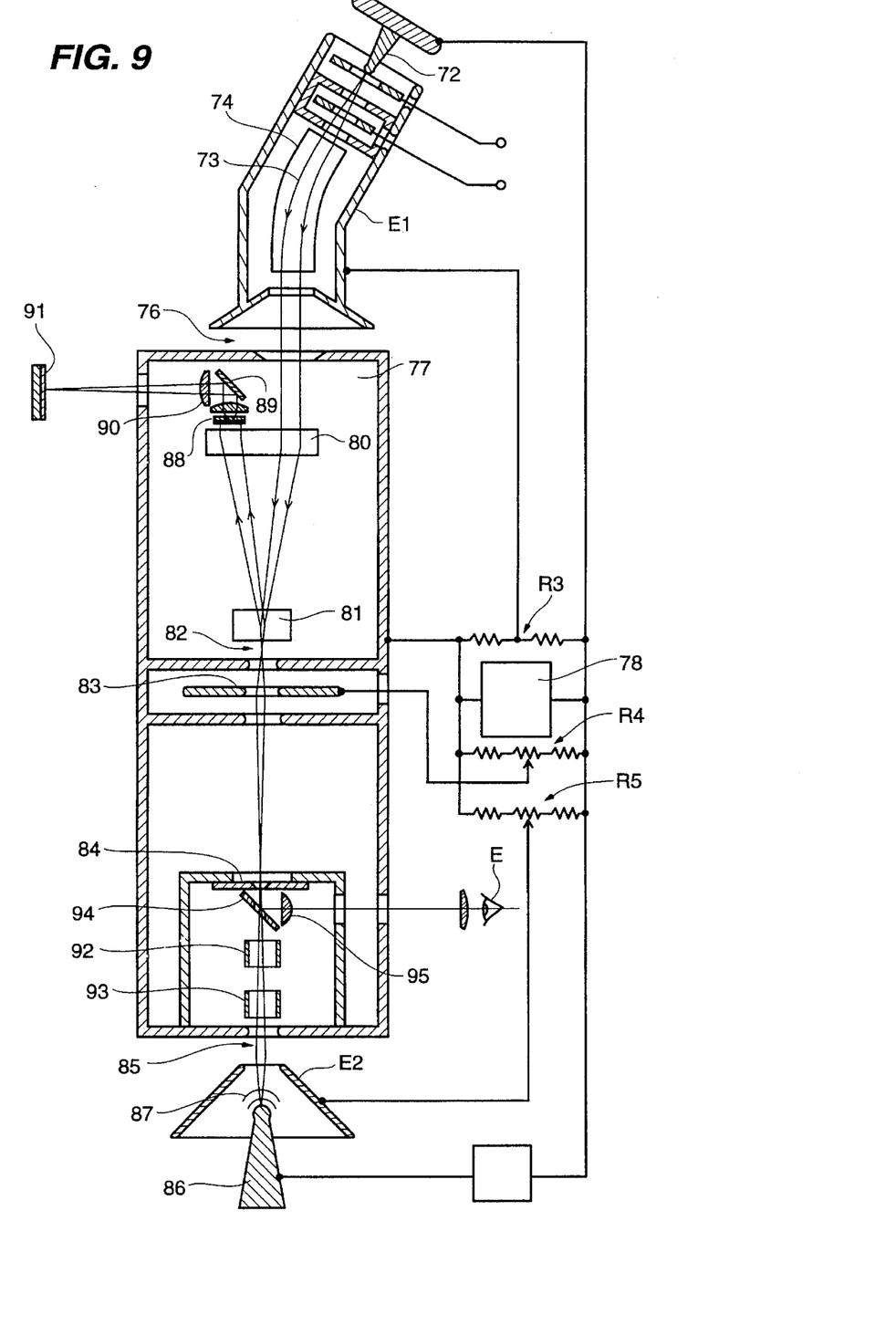
FIG. 9 is a vertical sectional view, partially schematic, of a preferred arrangement of the ion microscope utilizing two stages of electrostatic lens magnification.

FIG. 9 shows a preferred arrangement of the ion microscope which utilizes two stages of electrostatic lens image magnification. In this arrangement, the ion illuminator uses a gaseous field ion source (GFIS). This type of source, described in considerable detail by K. Jousten, K. B öhringer, R. Börret and S. Kalbitzer in *Ultramicroscopy*, vol. 26, page 301 and by R. Börret, K. Jousten an S. Kalbitzer, 1988 *Journal of Physics D. Applied Physics*, vol. 21 page 1835, makes use of the high intensity electric field at the end of a cooled sharply pointed electrode to cause the ionization of the gas atoms or molecules which condense upon the electrode. This type of source, utilizing what is called a 'super tip', is capable of producing an ion beam of low divergence from a very small source area. A beam having these characteristics facilitates obtaining a high level of object illumination. The axial velocity spread that is obtained from this source, however, is excessive for optimum microscope performance, and, in the arrangement illustrated, a filter is included to permit reduction of this velocity spread.

Referring to FIG. 9, the sharply pointed electrode 72 provides the source of positive ions which are drawn from its end as an ion beam 73. The magnetic field region 74 causes deflection of the beam according to ion velocity, giving rise to a spread in the apparent source position. The beam is made convergent by field lens 76 as it enters into the enclosure 77 held at a high negative potential relative to the source by power supply 78. The beam is provided with an offset by magnetic field regions 80 and 81. The field lens provides an image of the dispersed ion source at 82 and the second stage lens 83 magnifies this image and projects it upon the aperture plate 84.

The aperture plate restricts the passage to provide the needed limitation on the aperture angle for the illumination beam, and also serves to limit the velocity spread according to the portion of the dispersed beam that is incident on the aperture. The ion beam is directed by the electrostatic lens 85 toward the object mounting electrode 86 in such a convergence that the ions have a near normal incidence to the surface of this electrode. The ions are decelerated as they approach the surface and then accelerated back toward the objective lens by the presence of the electrostatic field 87. The reflected ion beam passes back through the lens 85. Electrical potentials for electrodes E1, 82 and E2 are obtained from three voltage dividers R3, R4 and R5 as shown in FIG. 9.

This lens, combined with the lens 83, causes the ion beam to project an enlarged image of the surface of the objects onto the detector 88 according to the localized interactions of the ion beam with the surface. The ion detector shown here is a fluorescent screen. The mirror 89 and light lens 90 are provided to project an enlarged image of the fluorescent screen onto the light image detector 91. Magnification provided by the light optics helps to avoid excessive magnification of the source image on the aperture plate by reducing the amount of magnification required by lens 83.

Figure 10:
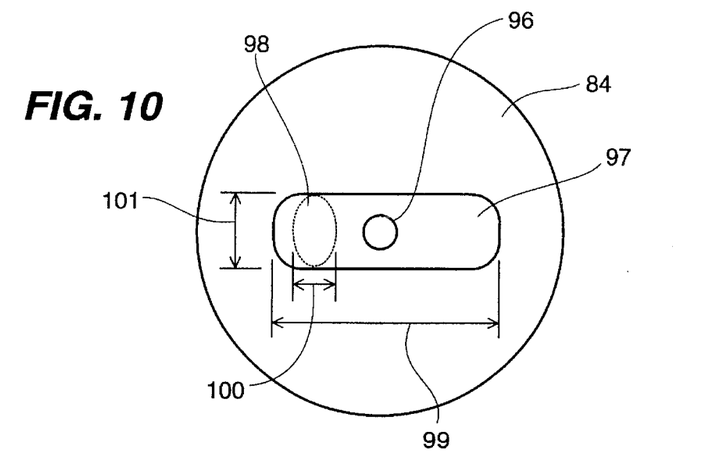
FIG. 10 is a plan view of the incident pattern on an aperture plate of a velocity dispersed ion beam.

In FIG. 10 the aperture plate 84 is shown in a sectional view. In this arrangement, the relative sizes of the aperture 96 and the region of incidence 97 of the illumination beam on the aperture plate are shown. Also shown is an area 98 that represents a region of incidence of ions of a uniform velocity. To obtain adequate beam current through the aperture, the size of illuminated area 97 needs to be limited relative to the size of the aperture. The size of the aperture is determined mainly by the system requirements relating to the microscope's resolving power.

The length 99 of the illuminated area relates to the beam dispersion and this needs to be an adequate multiple of the dimension 100 to obtain the needed restriction of the axial velocity of the ions passing through the aperture. Both the length 100 and the width 101 of the area are dependent on the source image as represented by 98.

To limit the size of image 98, it is necessary to have the source size small, the field lens' aberrations low, and the magnification low. With the GFIS, the source size is small, and, because it has low beam divergence, the field lens can be designed to have low aberration. Because the detector 88 is located between the illuminator lens 76 and the beam separating magnetic fields 80 and 81, as shown in FIG. 9, magnification of the object image by the second stage lens 83 results in a corresponding magnification of the illuminating beam's image on the aperture plate. To minimize this magnification, the detector should be capable of the highest resolution possible and the objective lens should have a short focal length.

Also shown in FIG. 9 is structure to facilitate ion beam alignment comprising electrostatic deflection plates 92 and 93, and light optics mirror 94 and lens 95. It is necessary for the illuminating beam to be aligned with considerable precision, especially between the objective lens center and the center of the OME. To provide for this alignment, electrostatic deflection plates can be used which are able to cause both ion beam transverse displacement and direction change. If the incident beam, passing through the aperture, also passes through the center of the lens, and is properly focused at the electrostatic center of the OME, the beam will have normal incidence at the surface of the OME, and will retrace its path through both the lens and the aperture. The most sensitive and important indication of this alignment is provided by observation of the position of the return beam on the aperture plate. The return beam side of the aperture plate can be coated with fluorescent material and observed. Observation of the return beam pattern on this plate also provides information on the uniformity of the object surface. If the surface is excessively rough, the pattern will be spread and the imaging of object detail likely will be difficult. Motion of the aperture plate or deflection of the ion beam can serve to obtain passage of the return beam from areas of the object surface that cause relatively large average deflections of the beam. Observation of the return beam pattern on the aperture plate is indicated by the indication of a human eye, at E in FIG. 9, for viewing the return beam through lens 95 and mirror 94, thus providing structure mirror 94 and lens 95, for monitoring the return beam.

Figure 11:
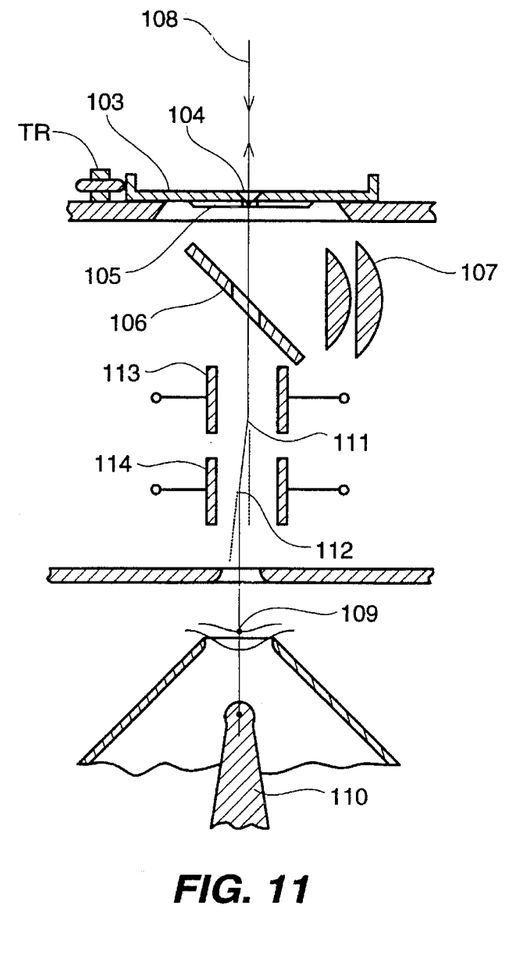
FIG. 11 is a vertical sectional view of the beam alignment structure.

FIG. 11 illustrates an arrangement for alignment in which 103 is the aperture plate having an aperture 104, and a surface coating 105 which fluoresces under ion beam impact. Light optics comprising mirror 106 and lens 107 are utilized in observing this fluorescent surface, and the position of the return beam on the aperture plate. The ion beam 108 after passing through the aperture is caused to pass through the lens center 109, and to be directed at the electrostatic center 110 of the OME by means of deflections at 111 and 112, utilizing the electrostatic deflection plates 113 and 114. When alignment is obtained, the return beam should be observed to be centered on the aperture. A threaded rod TR (FIG. 11) is used to cause motion of the aperture plate 103 to assist in obtaining alignment.

Figure 12:
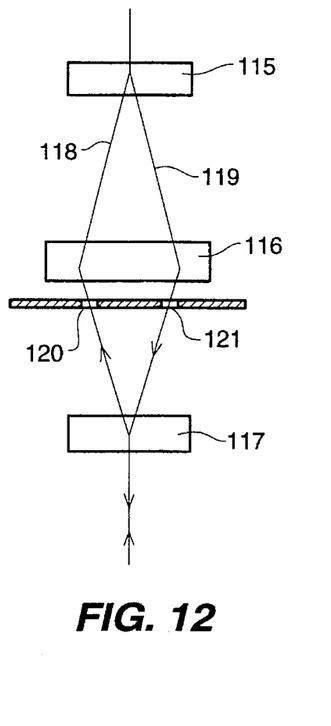
FIG. 12 is a vertical sectional view of the structure of separate apertures for illuminating and imaging ion beams.

In some cases, it is best to have separate apertures for the incident ion beam and the return ion beam. In a microscope having two stages of ion lens magnification, both the incident and the return beams need to pass through both lenses near their center. In this case, if the incident and return beams are separated to pass through the separate apertures, they must be recombined. The arrangement in FIG. 12 shows how this can be accomplished. Areas 115, 116, and 117 are magnetic field regions causing the deflections of the ion beams 118 and 119 as shown, and 122 is the aperture plate with apertures 120 and 121.

From the foregoing description, it will be apparent that the electrostatic repulsion ion microscope of the present invention has a number of advantages, some of which have been described above and others of which are inherent in the invention. Also it will be understood that modifications can be made to the electrostatic repulsion ion microscope described above without departing from the teachings of the present invention. Accordingly, the scope of the invention is only to be limited as necessitated by the accompanying claims.

I claim:

1. An ion microscope comprising:

an ion source for generating a beam of positive ions;

an object mounting electrode (OME) having a convex end for receiving an object to be viewed and having an electrical potential relative to said ion source sufficient to repel positive ions;

an enclosure having a negative electrical potential relative to said ion source into which the ions are drawn as a beam of positive ions from said ion source toward said OME and generating said beam of repelled positive ions;

an ion detector for detecting the spatial relationship of said beam of repelled positive ions and for generating an image of said object received by said OME;

an electrostatic lens, having an entrance pupil, for directing said beam of positive ions toward an electrostatic center of said convex end of said OME, so as to have a near normal incidence to a surface of said convex end of said OME, such that when said beam of positive ions is repelled, the repelled beam of positive ions return back through said electrostatic lens toward said ion detector, with said electrostatic lens causing the repelled ion beam to be focused upon said detector and to project said image of said object upon it; and a magnetic source for producing a magnetic field for deflecting said beam of positive ions and said beam of repelled positive ions sufficient to enable said ion detector to be located outside of a path of said beam of positive ions prior to being repelled.

2. The ion microscope of claim 1 further comprising an aperture plate located at said entrance pupil of said electrostatic lens, and having an aperture which limits an aperture angle and transverse velocity of said beam of positive ions.

3. The ion microscope of claim 2 where said ion source is a gaseous field ion source including, a magnet which deflects said beam of positive ions to a degree dependent on beam velocity, and an ion source electrostatic lens which focuses the beam of positive ions at said aperture plate.

4. The ion microscope of claim 1 further comprising an aperture plate located at said entrance pupil of said electrostatic lens, and having an aperture which limits an aperture angle and modulates an intensity of said beam of repelled positive ions, as a function of localized beam deflections at the surface of said object.

5. The ion microscope of claim 4 further comprising means for observing a position and a distribution of said beam of repelled positive ions at said aperture plate, and an aperture plate adjustment mechanism for variably positioning said aperture plate in a direction traverse to said beam of repelled positive ions.

6. The ion microscope of claim 4 further comprising, located between said electrostatic lens and said aperture plate, means for observing a position and a distribution of said beam of repelled positive ions at said aperture plate, and a beam deflector for deflecting said beam of positive ions.

7. The ion microscope of claim 1 wherein said electrostatic lens includes a first lens electrode and a second lens electrode both electrodes having a negative electrical potential relative to said electrical potential of said OME;

said first lens electrode, having a hollow conical shape including a tapered end facing said second lens electrode and being located between said OME and said second lens electrode; and wherein said electrical potential of said first lens electrode is between said electrical potential of said OME and said electrical potential of said second electrode.

8. The ion microscope of claim 1 wherein said electrostatic lens includes a first lens electrode and a second lens electrode both electrodes having a negative electrical potential relative to said electrical potential of said OME;

said first lens electrode being essentially planer and located between said OME and said second lens electrode;

said second lens electrode being essentially cylindrical in shape; and wherein said electrical potential of said first lens electrode is between said electrical potential of said OME and said electrical potential of said second electrode.

9. The ion microscope of claim 1 where said ion source is a gaseous field ion source.

10. The ion microscope of claim 1 where said OME includes a cavity in a center of said convex end, within which said object can be received.

11. The ion microscope of claim 10 wherein said OME further includes a drive device for advancing said object received within said cavity.

12. The ion microscope of claim 1 wherein said ion detector includes a fluorescent screen which emits light upon ion impact thereby emitting a light image, a light optical lens which projects and enlarges said light image emitted by the fluorescent screen, and a light sensitive detector for receiving the enlarged light image.

13. An ion microscope comprising:

a source of positive ions;

an electrode having a negative electrical potential relative to the source of positive ions serving to draw ions from the source and produce a divergent beam of positive ions;

an object mounting electrode (OME) having a convex end for receiving an object to be viewed and having an electrical potential relative to said ion source sufficient to repel positive ions from said source;

a first electrostatic lens whereby said ion beam is caused to converge to a focus;

an enclosure region positioned between the source of positive ions and the OME, and held at a negative electrical potential relative to the source of positive ions, into which the beam of ions is directed toward said OME for generating a beam of repelled positive ions;

a second electrostatic lens, having an entrance pupil, for directing said beam of positive ions toward an electrostatic center of said convex end of said OME, so as to have a near normal incidence to a surface of said convex end of said OME, such that when said beam of positive ions is repelled, the repelled beam of positive ions return back through said second electrostatic lens toward an ion detector, with said second electrostatic lens causing the repelled ion beam to be focused upon said detector and to project an image of said object upon it;

an aperture plate located at a point of convergence of said beam of positive ions at said entrance pupil of said second electrostatic lens, and having an aperture that limits a diameter of said beam of positive ions;

a magnetic source for producing a magnetic field for deflecting said beam of positive ions from the source and said beam of repelled positive ions to an extent sufficient to enable said ion detector to be located outside of a path of said beam of positive ions from the source.

14. The ion microscope of claim 13 further comprising a second magnetic source for producing a second magnetic field located between the ion source and said first electrostatic lens, for causing ion beam deflection as a function of ion velocity and serving thereby to cause a transverse dispersion of a focal position of the ion beam on the aperture plate as a function of ion velocity and to thereby cause a restriction in the range of velocities of the ions passing through said aperture plate.

15. The ion microscope of claim 14 in which the source of positive ions is a gaseous field ion source.

16. A method for operating an ion microscope comprising the steps of:

providing an ion source for generating a beam of positive ions;

directing the beam of positive ions at an object mounting electrode (OME) having a convex end for receiving an object to be viewed and having an electrical potential relative to said ion source sufficient to repel positive ions;

providing an enclosure having a negative electrical potential relative to said ion source into which the ions are drawn as said beam of positive ions from said ion source toward said OME for generating a beam of repelled positive ions;

detecting with an ion detector the spatial relationship of said beam of repelled positive ions and generating an image of said object received by said OME;

directing with an electrostatic lens, said beam of positive ions toward an electrostatic center of said convex end of said OME, so as to have a near normal incidence to a surface of said convex end of said OME, such that when said beam of positive ions is repelled, the repelled beam of positive ions return back through said electrostatic lens toward said ion detector, with said electrostatic lens causing the repelled ion beam to be focused upon said detector and to project said image of said object upon it; and providing a magnetic field for deflecting said beam of positive ions and said beam of repelled positive ions sufficient to enable said ion detector to be located outside of the a of said beam of positive ions prior to being repelled.

\* \* \* \* \*